United States Patent [19]

Chen

[11] Patent Number: 5,731,723
[45] Date of Patent: Mar. 24, 1998

[54] HALF SYMBOL DELAY CALIBRATION FOR PHASE WINDOW CENTERING

[75] Inventor: Shin Chung Chen, Los Gatos, Calif.

[73] Assignee: Texas Instruments, Incorporated, Dallas, Tex.

[21] Appl. No.: 570,285

[22] Filed: Dec. 11, 1995

[51] Int. Cl.$^6$ ............................................ H03L 7/06
[52] U.S. Cl. .................. 327/157; 327/159; 327/161; 375/373; 375/374; 360/77.02
[58] Field of Search ..................... 327/146, 147, 327/148, 149, 150, 155–159; 331/1 A, 44; 375/373–376; 360/77.01, 77.02, 77.07, 77.08

[56] References Cited

U.S. PATENT DOCUMENTS

| | | | |
|---|---|---|---|
| 4,800,340 | 1/1989 | Maimone et al. | 331/1 A |
| 4,829,545 | 5/1989 | Guzik et al. | 360/51 |
| 5,343,167 | 8/1994 | Masumoto et al. | 331/2 |
| 5,374,900 | 12/1994 | Masumoto | 331/1 A |
| 5,534,823 | 7/1996 | Kondou | 331/16 |
| 5,559,645 | 9/1996 | Miyazawa et al. | 360/51 |

*Primary Examiner*—Timothy P. Callahan
*Assistant Examiner*—Kenneth B. Wells
*Attorney, Agent, or Firm*—W. Daniel Swayze, Jr.; W. James Brady; Richard L. Donaldson

[57] ABSTRACT

The present invention provides a method and apparatus for half symbol delay calibration for phase window centering. To perform calibration of phase window centering, a carefully designed input signal is applied to the data signal input of a phase detector and a corresponding gating signal is applied to each of two D flip-flops. A calibration circuit produces the gating signal to enable the D flip-flops and the complement of the gating signal to temporarily prevent disturbance of a charge pump. In the preferred embodiment of the present invention, the calibration circuit provides a divide-by-4 clock function. The carefully designed input signal used for calibration includes on-time pulses and time-shifted pulses. The on-time pulses have rising edges that rise with the rising edges of the VCO clock signal. The time-shifted pulses follow the on-time pulses by 2.5 clock cycles of the VCO clock signal. If the half symbol delay is optimized, the phase detector will be equally likely to produce a pump up or a pump down signal. If the time-shifted pulses occur early or late relative to the rising edges of the VCO clock signal, then there will be more pump up or more pump down signals respectively. This information is used to calibrate the half symbol delay.

8 Claims, 6 Drawing Sheets

HALF SYMBOL DELAY CALIBRATION FOR PHASE WINDOW CENTERING

BACKGROUND OF THE INVENTION

1. Field of the Invention

The present invention relates generally to data synchronizer circuits, and more specifically to a method and apparatus for calibrating half symbol delay in a data synchronizer circuit.

2. Background Art

Computer systems employ data storage devices, for example, disk drives, to store data for use by the computer system. A typical data storage device includes storage media, in which data is stored, a read head, and a mechanism, such as a motor, for imparting relative motion between the storage media and the read head. The relative motion allows access to various portions of the storage media, and, in the case of certain types of media, such as magnetic media, allows for the production of signals representative of the data stored in the storage media.

In general, disk memories are characterized by the use of one or more magnetic media disks mounted on a spindle assembly and rotated at a high rate of speed. Each disk typically has two surfaces of magnetic media. In a typical rotating medium used as a storage system, data is stored on magnetic or magneto-optical disks in a series of concentric "tracks," with each track being an addressable area of the memory array. A read/write head is provided for each surface of each disk in the disk storage system. These tracks are accessed by a read/write head that detects variations in the magnetic orientation of the disk surface.

To provide retrieval of stored data from a storage medium, the fixed representation of the stored data in the storage medium must be converted into signals that may be processed to yield data in a form usable with a system such as a computer system. A read channel circuit is used to convert signals from the storage media to usable read data.

Information is often provided to a read channel in a bit stream format. A bit stream consists of a series of logical ones or zeros presented in serial fashion. To accurately decode a serial bit stream, the read channel must be able to detect each individual bit. To isolate each bit, a bit frame or bit window is defined about each bit. A bit window should only contain a single bit. If the window is too large, more than one bit of information may be contained within the window and one or all bits may be lost. If the bit window is too small, no detectable information will result. Further, loss of bit information at point locations may lead to error propagation throughout the decoding process.

For a variety of reasons, data bit streams may include a degree of "jitter" which tends to force a data bit near a bit window boundary. To maximize the efficiency of the data recovery system, it is desired to provide an accurately centered decode window as large as the theoretical window for the given data rate. To accomplish this in the prior art, the average or mean center bit position is established or estimated. A decode window is then defined having a nominal center coinciding with the mean center bit position of the data stream.

To ensure reliable recovery of data from a storage medium, the expected timing of the data must be accurately predicted. A phase window is established to provide a period of time over which data is expected to be received relative to a VCO clock reference signal. To establish the phase window, the data is delayed by a delay circuit prior to being provided to a phase detector. To maximize the likelihood of recovering the data, the phase window should be centered around the point in time at which the data is most likely expected to be received. If the phase window is properly centered and has proper width, a data pulse in the data signal will be accurately received even if phase jitter of the data signal causes the data pulse to be displaced somewhat relative to the center of the phase window.

Variations in semiconductor processing techniques yield read channel circuits with varying delay circuit performance. These delay circuits are known as "half symbol" or "⅓ cell" delay circuits. To compensate for these variations and achieve phase window centering, manual calibration of the half symbol delay or ⅓ cell delay circuits has been necessary.

A read channel circuit is used to read data from a storage device, for example a hard disk drive. A read channel circuit typically includes a pulse detector, a filter, servo circuits, a data synchronizer, a window shift circuit, a write precompensation circuit, an encoder/decoder (ENDEC), and a control circuit. The pulse detector detects and qualifies encoded read signals derived from the storage device. The filter further processes the encoded read signals to ensure frequency range and phase relationships of the encoded read signals are appropriate to allow read data to be recovered from the encoded read signals. The servo circuits capture servo information derived from the storage device which is used to assure that data to be read from the storage device has been accurately located.

In the read mode, the data synchronizer performs sync field search and data synchronization. The data synchronizer uses a phase locked loop (PLL) to provide data synchronization and to develop a decode window. The window shift circuit shifts the phase of the voltage controlled oscillator (VCO) of the PLL to effectively shift the relative position of the read data pulse within the decode window. In the write mode, the write precompensation circuit uses the data synchronizer to provide data encoding and independent late/early write precompensation for NRZ data. The ENDEC provides encoding and decoding, preferably of run length limited (RLL) signals. The control circuit coordinates and controls the operation of the aforementioned circuits and subsystems.

Figure 1:
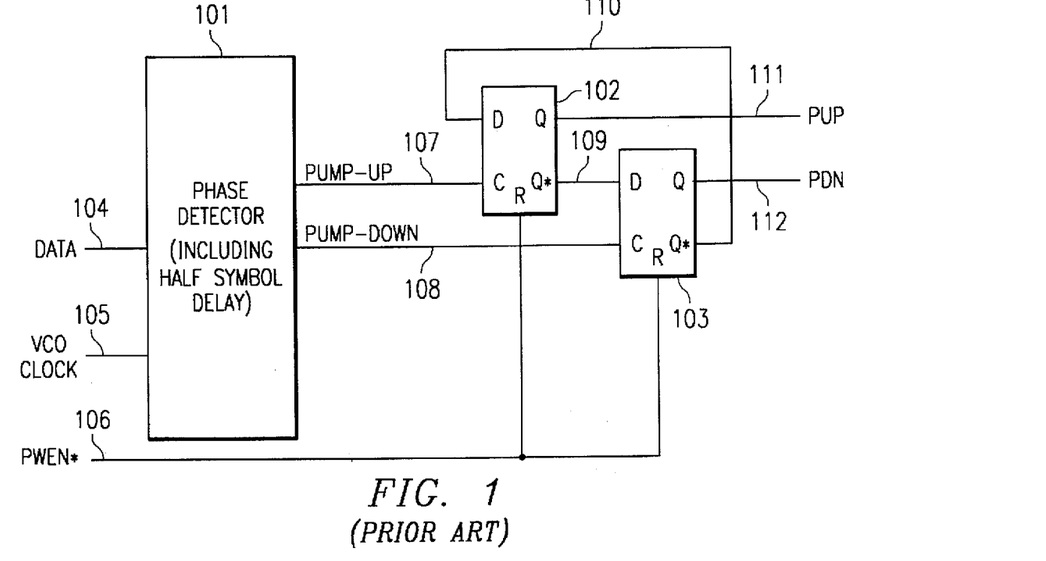
FIG. 1 is a block diagram illustrating a prior art technique for calibrating phase window centering.

FIG. 1 is a block diagram of a prior art phase detector circuit that includes D flip-flops 102 and 103 for calibrating phase window centering. DATA signal input 104 provides a data signal derived from a storage medium to phase detector 101. VCO CLOCK input 105 provides a VCO clock signal to phase detector 101. Phase detector 101 includes a half symbol delay circuit and provides a PUMP-UP signal at PUMP-UP signal output 107 and a PUMP-DOWN signal at PUMP-DOWN signal output 108. PUMP-UP signal output 107 is coupled to the clock input of D flip-flop 102. PUMP-DOWN signal output 108 is coupled to the clock input of D flip-flop 103. The Q output of D flip-flop 102 is coupled to PUP output 111. The Q output of D flip-flop 103 is coupled to PDN output 112. The Q* inverted output of D flip-flop 102 is coupled to the D input of D flip-flop 103 at node 109. The Q* inverted output of D flip-flop 103 is coupled to the D input of D flip-flop 102. PWEN* signal input 106 is coupled to the reset (R) inputs of D flip-flops 102 and 103.

The D flip-flops are enabled only when PWEN* signal input 106 has a low logic level. If a datum bit leads the clock pulse, the phase detector will produce a pulse at PUMP UP signal output 107 that occurs earlier in time and longer in width than that of the pulse at PUMP DOWN signal output 108. The phase difference of DATA signal input 104 and VCO CLOCK signal input 105 is equal to the difference of the pulse widths of PUMP UP signal output 107 and PUMP DOWN signal output 108. Conversely, if the datum bit lags the clock pulse, the phase detector will output a pulse at PUMP DOWN signal output 108 that occurs earlier in time and longer in width than that of the pulse at PUMP UP signal output 107. The phase difference of DATA input signal 104 and VCO CLOCK signal input 105 is, likewise, equal to the difference of the pulse widths of PUMP UP signal output 107 and PUMP DOWN signal output 108.

D flip-flops 102 and 103 are connected so that their outputs are mutually exclusive. That is, when the pulse at PUMP UP signal output 107 from phase detector 101 occurs earlier than the pulse at PUMP DOWN signal output 108, the PUP signal output 111 of D flip-flop 102 will be at a high logic level and the PDN signal output 112 of D flip-flop 103 will be at a low logic level. Conversely, when the pulse at PUMP DOWN signal output 108 from phase detector 101 occurs earlier than the pulse at PUMP UP signal output 107, PDN signal output 112 of D flip-flop 103 will be at a high logic level and the PUP signal output 111 of D flip-flop 102 will be at a low logic level. However, if pulses occur at PUMP UP signal output 107 and PUMP DOWN signal output 108 in close proximity in time to each other, a race condition may result, causing both PUP signal output 111 and PDN signal output 112 to have a high logic level. Such a race condition results from violation of finite set-up and hold time requirements of D flip-flops 102 and 103. In phase window centering circuits, such a condition may be used to indicate that the signals at PUMP UP signal output 107 and PUMP DOWN signal output 108 are phase locked to each other. The signals are phase locked to each other when no phase error between them is detected by phase detector 101.

To calibrate phase window centering, an input signal comprising a stream of on-time bits and a bit that is phase shifted from the rest of the bits by exactly an integer number plus one half cycles of the VCO clock and sandwiched between the on-time bits is applied to DATA input 104 of phase detector 101. By properly gating D flip-flops 102 and 103 with PWEN* signal input 106, calibration can be performed. First, the number of pulses occurring on PUP signal output 111 are counted and the number of pulses occurring on PDN signal output 112 are counted for a preallocated interval of time of sufficient length to produce a confident statistical result.

If the number of pulses on PUP signal output 111 is greater than the number of pulses on PDN signal output 112, the half symbol delay should be lengthened and the pulses on PUP signal output 111 and PDN signal output 112 should again be counted over a preallocated time interval. This step should be repeated until the number of pulses counted on PUP signal output 111 equals the number of pulses counted on PDN signal output 112. When the number of pulses counted is equal, the half symbol delay is optimized and phase window centering is achieved.

If, however, the number of pulses on PUP signal output 111 is less than the number of pulses on PDN signal output 112, the half symbol delay should be shortened and the pulses on PUP signal output 111 and PDN signal output 112 should again be counted over a preallocated time interval. This step should be repeated until the number of pulses counted is equal, at which time the half symbol delay will be optimized and phase window centering is achieved.

It can be seen that this method requires delicate manual adjustments, especially in the timing of signals on PWEN* signal input 106 and the gating of the D flip-flops 102 and 103. The phase relationship between the occurrences of the signals on PWEN* signal input 106 and the shifted bit signals are of critical importance. Tedious trial and error procedures are needed to achieve satisfactory results. In addition, the shifted bit disturbs the steady state of the PLL, requiring a long setting time (a long stream of on-time bits) to bring the PLL to the steady state before another shifted bit can be applied. Insufficient settling of the PLL back to its steady state will decrease the accuracy of the phase window centering while excessive settling will increase the calibration time. Thus, an approach to calibration of phase window centering that avoids manual adjustments and tedious trial and error procedures, does not disturb the steady state of the PLL, and minimizes calibration time is needed.

SUMMARY OF THE INVENTION

The present invention provides a method and apparatus for half symbol delay calibration for phase window centering. The present invention avoids the need for tedious manual calibration procedures. The present invention avoids the need for precisely timed signals on the calibration enable input. The present invention also avoids disturbing the steady state of the PLL, thereby avoiding unnecessary PLL settling time and minimizing calibration time.

The present invention includes calibration circuitry that includes combinational and sequential logic circuits. To perform calibration of phase window centering, a carefully designed input signal is applied to the data signal input of a phase detector and a corresponding gating signal is applied to each of two D flip-flops. An enable signal is used to place the circuit into a calibration mode. A calibration circuit produces the gating signal to enable the D flip-flops and the complement of the gating signal to temporarily "gate off" inputs to a charge pump. By "gating off" the inputs to the charge pump, a logic gate is used in conjunction with the gating signal to prevent signals that would otherwise adjust the operation of the charge pump from being applied to the charge pump. Thus, the operation of the charge pump is not adversely affected while calibration is being performed. In the preferred embodiment, the calibration circuit provides a divide-by-4 clock function. The calibration circuit is triggered by the first pulse corresponding to an on-time data pulse on either of two outputs of the phase detector after the enable signal goes low. The enable signal is designed to become active after the PLL is properly phase-locked to the on-time pulses.

In the preferred embodiment of the present invention, the carefully designed input signal used for calibration includes on-time pulses and time-shifted pulses. The on-time pulses represent regular data, while the time-shifted pulses are introduced to allow calibration of the half symbol delay circuit. As these pulses enter the half symbol delay circuit and the phase detector, they have not yet been delayed by the half symbol delay circuit. Thus, non-delayed on-time pulses and non-delayed time-shifted pulses are present at the input to the half symbol delay circuit and the phase detector. After the pulses pass through the half symbol delay circuit, they become delayed on-time pulses and delayed time-shifted pulses, respectively, since they have been delayed by the half symbol delay circuit by an amount of time equal to one half the period of the VCO clock signal.

The delayed (half symbol delayed) on-time pulses have rising edges that rise with the rising edges of the VCO clock signal. The time-shifted pulses follow the on-time pulses by 2.5 clock cycles of the VCO clock signal. Therefore, the rising edge of the delayed time-shifted pulses should occur at exactly the mid-point between two consecutive rising edges of the VCO clock signal. These mid-points define the boundaries of the phase window.

If the rising edge of a non-delayed time-shifted pulse is early relative to the rising edge of the VCO clock signal, a pump up signal is generated. If, however, the rising edge of a non-delayed time-shifted pulse is late relative to the rising edge of the VCO clock signal, a pump down signal is generated. Comparison of pump up and pump down signals over time allows calibration of the half symbol delay circuit.

Since the VCO clock signal is precisely synchronized with the on-time pulses, if the half symbol delay is optimized, then the rising edges of the non-delayed time-shifted pulses will occur at precisely the same time as the rising edges of the VCO clock signal. If the half symbol delay is optimized, the phase detector will have equal probability of producing pump up or pump down signals. Since the pump up and pump down signals (produced by the time-shifted pulses) are being gated off selectively before going to the charge pump circuit, the steady state condition of the PLL will not be disturbed. Thus, the present invention overcomes the disadvantages of the prior art.

DETAILED DESCRIPTION OF THE INVENTION

A method and apparatus for providing half symbol delay calibration for phase window centering in data read channels is described. In the following description, numerous special details are set forth in order to provide a more thorough understanding of the present invention. It will be apparent, however, to one skilled in the art, that the present invention may be practiced without these special details. In other instances, well-known features have not been described in detail in order not to unnecessarily obscure the present invention.

In data read channel circuits, variations in semiconductor processing techniques result in inconsistencies in half symbol delay circuits. The delays provided by some circuits may be relatively shorter, while the delays of others may be relatively longer. To achieve consistent performance, the half symbol delay circuits must be calibrated. The present invention provides a method and apparatus for half symbol delay calibration for phase window centering. The present invention avoids the disadvantages of the prior art, which include the need for tedious manual adjustment to achieve half symbol delay calibration. The present invention also provides reliable phase window centering accuracy and requires no settling time between shifted bits, thereby reducing the calibration time drastically.

The present invention provides a method for providing half symbol delay calibration. The method preferably comprises a number of steps. The first step involves applying an on-time pulse to an input of a half symbol delay circuit. This step is used to provide the initial synchronization of the PLL to the on-time data pulses and thereby establishes a timing relationship between the VCO clock signal and the on-time data pulses. In order to achieve the initial synchronization, a series of on-time data pulses should be applied to the PLL. The series of on-time data pulses should be long enough to allow the PLL to become phase-locked to the series of on-time data pulses. Since the characteristics of the programmable filter used in the system are known, a length of time sufficient to allow the PLL to become phase-locked can be easily determined.

After the initial synchronization of the PLL and the on-time data pulses has been completed, a time-shifted pulse is applied to an input of the half symbol delay circuit. A comparison of the timing of the time-shifted pulse relative to the VCO clock signal is made. A charge pump charging signal and a charge pump discharging signal are produced. The charge pump charging and discharging signals are used for calibration purposes. The durations of time when the charge pump charging signal and the charge pump discharging signal are active are based on the timing relationship between the time-shifted pulse and the VCO clock signal.

A signal is produced based on the logical OR of the charge pump charging signal and the charge pump discharging signal. A timing signal is produced having a period equal to an integer multiple of the clock period of the VCO clock signal. An output signal is produced based on the charge pump charging signal and the timing signal. Another output signal is produced based on the charge pump discharging signal and the timing signal.

The present invention provides an apparatus for providing half symbol delay calibration. One embodiment of the apparatus comprises a half symbol delay circuit, a phase detector, a calibration circuit, a charge pump circuit, and a voltage controlled oscillator. The half symbol delay circuit introduces a delay in a data pulse signal that comprises a data pulse. The phase detector is coupled to the half symbol delay circuit and detects the phase of the data pulse and also provides two output signals. The calibration circuit is coupled to the phase detector and allows calibration of the delay and also provides a calibration circuit output signal. The charge pump circuit is coupled to the calibration circuit and receives the two output signals from the phase detector as well as the calibration circuit output signal and provides a charge pump output signal. The voltage controlled oscillator is coupled to the charge pump circuit and receives the charge pump output signal and also provides a voltage controlled oscillator output signal.

Another embodiment of the present invention comprises a phase detector, a logic gate, and three D flip-flops. The phase detector detects the phase of a data pulse and provides two output signals. The logic gate is coupled to the phase detector and receives the two output signals and provides a third output signal. The first D flip-flop is coupled to the logic gate and receives the third output signal and also provides a fourth output signal. The second D flip-flop is coupled to the first D flip-flop and receives the fourth output signal and also provides a fifth output signal. The third D flip-flop is coupled to the first D flip-flop and receives the fourth output signal and also provides a sixth output signal.

The present invention may be practiced with a second logic gate coupled to the phase detector and to the second D flip-flop for receiving the first output signal and the fifth output signal and for providing a seventh output signal. Also, a third logic gate is coupled to the phase detector and to the second D flip-flop for receiving the second output signal and the fifth output signal and for providing an eighth output signal. Additionally, a charge pump is coupled to the second logic gate and the third logic gate for receiving the seventh output signal and the eighth output signal and for providing a ninth output signal. Furthermore, a voltage controlled oscillator is coupled to the charge pump for receiving the ninth output signal and for providing a tenth output signal. The second D flip-flop further provides an eleventh output signal with the third D flip-flop being coupled to the second flip-flop for receiving the eleventh output signal.

Figure 2:
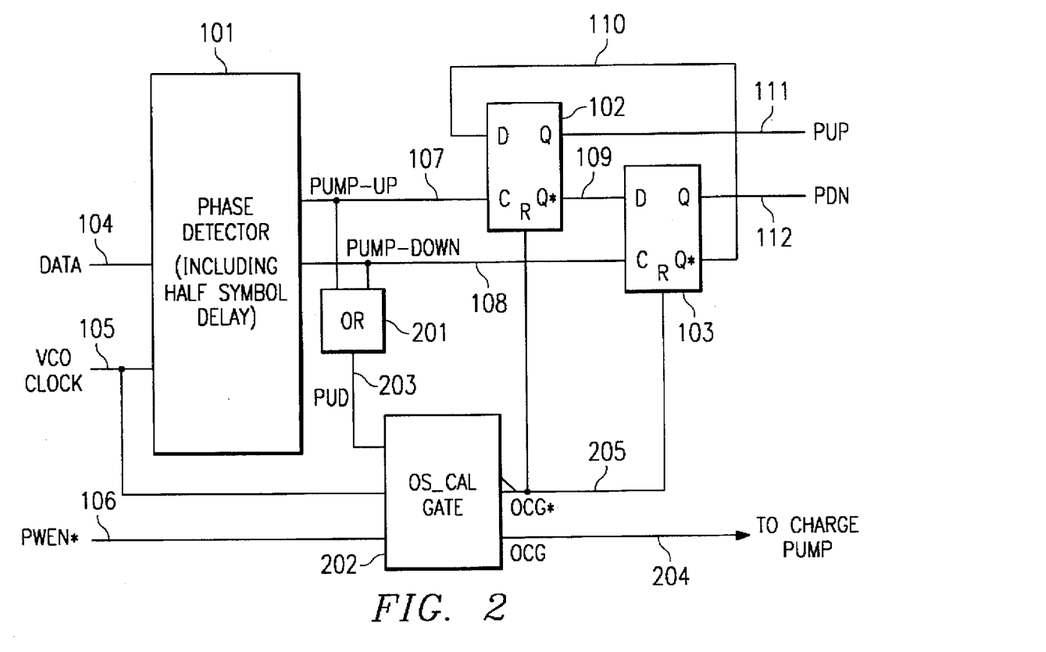
FIG. 2 is a block diagram illustrating a PLL to perform phase window centering calibration apparatus of the present invention.

FIG. 2 illustrates a block diagram of a PLL incorporating the present invention. Data signal input 104 is coupled to phase detector 101. VCO CLOCK input 105 is coupled to both phase detector 101 and OS_CAL GATE 202. Phase detector 101 provides PUMP UP signal output 107 to the ock input of D flip-flop 102 and to an input of OR gate 201. Phase detector 101 provides PUMP DOWN signal output 108 to the clock input of D flip-flop 103 and to an input of OR gate 201. OR gate 201 provides PUD signal output 203 to OS_CAL GATE 202. OS_CAL GATE 202 provides OCG output 204 to a charge pump circuit. OS_CAL GATE 202 provides OCG* inverted output 205 to reset inputs of D flip-flops 102 and 103. Signal input PWEN* at node 106 is coupled to OS_CAL GATE 202.

The Q output of D flip-flop 102 provides a PUP output signal at PUP output 111. The Q* inverted output of D flip-flop 102 is coupled to the D input of D flip-flop 103 at node 109. The Q output of D flip-flop 103 provides a PDN output signal at PDN output 112. The Q* inverted output of D flip-flop 103 is coupled to the D input of D flip-flop 102 via node 110.

To perform calibration of phase window centering, a carefully designed input signal is applied to data signal input 104 of phase detector 101 and a corresponding OCG* gating signal 205 is applied to D flip-flops 102 and 103. PWEN* signal 106 is not used as in the prior art, but is used as an enable signal for the calibration mode. OS_CAL GATE 202 produces a OCG* gating signal 205 to enable D flip-flops 102 and 103 and its complement OCG signal 204 to temporarily disable a charge pump. In the preferred embodiment, OS_CAL GATE 202 provides a divide-by-4 clock function. OS_CAL GATE 202 is triggered by the first pulse after PWEN* signal 106 goes low on either PUMP UP signal output 107 or PUMP DOWN signal output 108.

Figure 3:
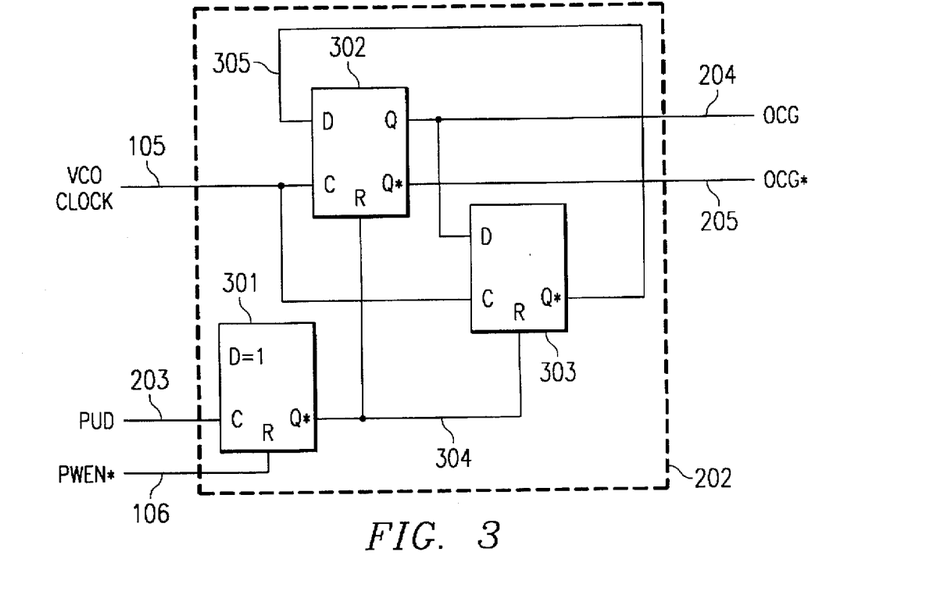
FIG. 3 is a block diagram illustrating the preferred embodiment of OS_CAL gate 202.

FIG. 3 illustrates a block diagram of OS_CAL GATE 202. OS_CAL GATE 202 comprises D flip-flops 301, 302, and 303. PUD signal input 203 is coupled to the clock input of D flip-flop 301. PWEN* signal input 106 is coupled to the reset input of D flip-flop 301. The D input of D flip-flop 301 is coupled to a high logic level. The Q* inverted output of D flip-flop 301 is coupled to the reset inputs of D flip-flops 302 and 303 via node 304.

VCO clock signal input 105 is coupled to the clock inputs of D flip-flops 302 and 303. The Q output of D flip-flop 302 is coupled to the D input of D flip-flop 303 and to OCG output 204. The Q* inverted output of D flip-flop 302 is coupled to OCG* output 205. The Q* inverted output of D flip-flop 303 is coupled to the D input of D flip-flop 302 via node 305.

When PWEN* enable signal input 106 is at a high logic level, it asserts the reset input of D flip-flop 301, forcing the Q* output of D flip-flop 301 to provide a high logic level at node 304. While node 304 is at a high logic level, the reset inputs of D flip-flops 302 and 303 are asserted, forcing the Q output of D flip-flop 302 to a low logic level and the Q* outputs of D flip-flops 302 and 303 to a high logic level. Thus, OCG output 204 is forced low and OCG* output 205 is forced high while PWEN* enable signal input 106 is high.

When PWEN* enable signal input 106 goes to a low logic level, the Q* output of D flip-flop 301 is no longer forced high by a reset condition, but still remains high since no action has been taken to make D flip-flop 301 change state. However, since the D input of D flip-flop 301 is tied to a high logic level, the next rising edge of PUD signal input 203 clocks in the high logic level at the D input, causing the Q* output of D flip-flop 301 to go to a low logic level. When the Q* output of D flip-flop 301 goes low, node 304 goes low, causing the reset inputs of D flip-flops 302 and 303 to be deasserted.

When the reset inputs of D flip-flops 302 and 303 are deasserted, OCG output 204 remains low and OCG* output 205 along with the Q* output of D flip-flop 303 both remain high. The next rising edge of VCO clock 105 clocks the high logic level at node 305 through to OCG output 204 and the low logic level at OCG output 204 through D flip-flop 303 such that node 305 remains at a high logic level. This state will be referred to as the first state of OS_CAL GATE 202.

The next rising edge of VCO clock 105 clocks the high logic level at node 305 through to OCG output 204 and the high logic level at OCG output 204 through D flip-flop 303 such that node 305 goes to a low logic level. This state is referred to as the second state of OS_CAL GATE 202.

The next rising edge of VCO clock 105 clocks the low logic level at node 305 through to OCG output 204 and the high logic level at OCG output 204 through D flip-flop 303 such that node 305 remains at a low logic level. This state is referred to as the third state of OS_CAL GATE 202.

The next rising edge of VCO clock 105 clocks the low logic level at node 305 through to OCG output 204 and the low logic level at OCG output 204 through D flip-flop 303 such that node 305 goes to a high logic level. This state is referred to as the fourth state of OS_CAL GATE 202. Since this state is identical to the state in which OS_CAL GATE 202 is placed upon the deassertion of the reset inputs of D flip-flops 302 and 303, the next rising edge of VCO clock 105 will place OS_CAL GATE 202 into its first state, as described above.

Thus, OCG output 204 is at a high logic level during the first and second states of OS_CAL GATE 202 and at a low logic level during the third and fourth states of OS_CAL GATE 202. Since each of the states of OS_CAL GATE 202 lasts for one clock cycle of VCO clock 105, OCG output 204 provides a clock signal having one fourth the frequency of VCO clock 105. OCG output 204 remains high during two cycles of VCO clock 105, then goes low during the next two cycles of VCO clock 105.

Figure 4:
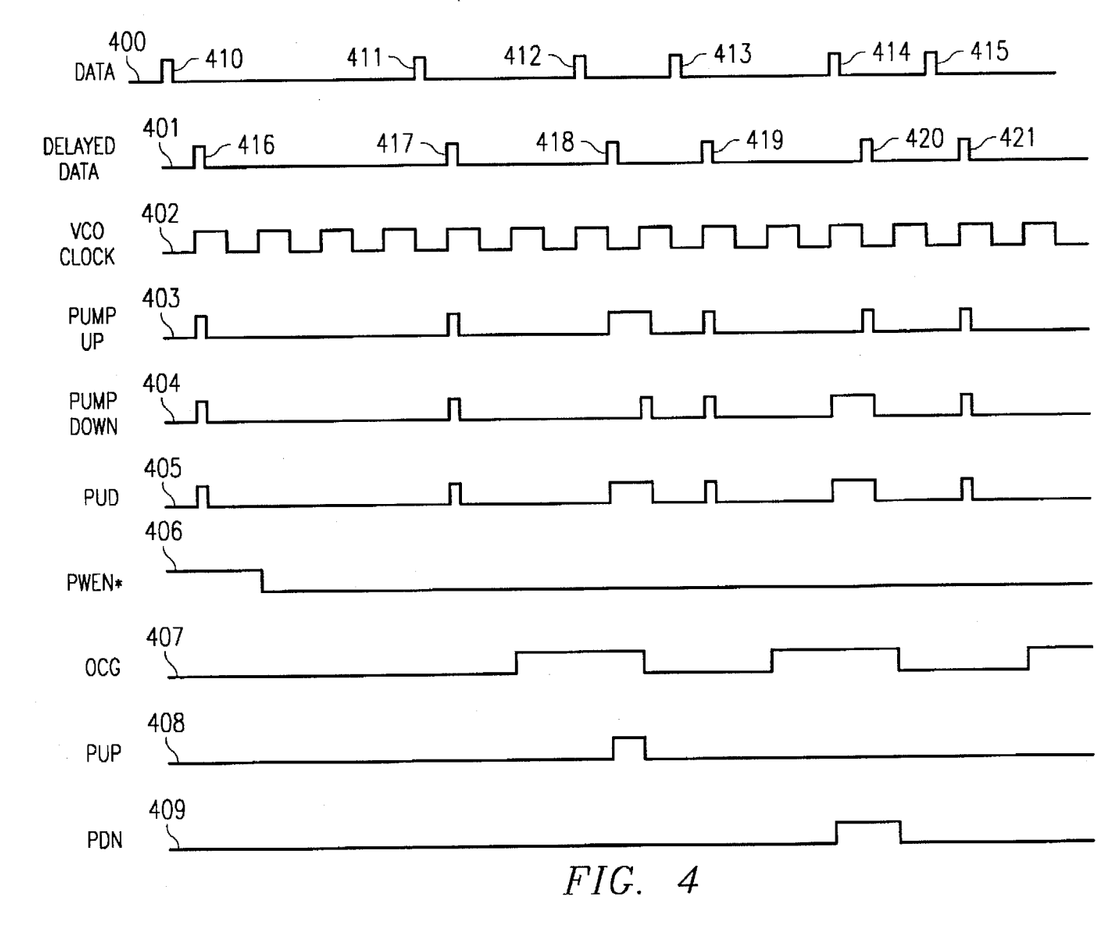
FIG. 4 is a timing diagram illustrating the relationships between the various signals in the preferred embodiment of the present invention.

FIG. 4 shows the timing relationship of signals related to the half symbol delay calibration circuitry. FIG. 4 includes waveforms 400, 401, 402, 403, 404, 405, 406, 407, 408, and 409. Waveform 400 represents an example of the signal present at DATA signal input 104. Waveform 401 represents an example of the delayed data, preferably an internal signal in phase detector 101. Waveform 402 represents an example of the clock signal present at VCO CLOCK signal input 105. Waveform 403 represents an example of the signal present at PUMP UP signal output 107. Waveform 404 represents an example of the signal present at PUMP DOWN signal output 108. Waveform 405 represents an example of the signal present at PUD signal output 203. Waveform 406 represents an example of the signal present at PWEN* signal input 106. Waveform 407 represents an example of the signal present at OCG signal output 204. Waveform 408 represents an example of the signal present at PUP signal output 111. Waveform 409 represents an example of the signal present at PDN signal output 112.

Data pulses 410, 411, 413, and 415 are non-delayed on-time data pulses and occur at approximately regular intervals of four cycles (or another number of cycles in other embodiments) of the VCO CLOCK signal (disregarding any phase jitter that may be present and that may slightly interfere with the regularity of the data pulses). Data pulses 412 and 414 are also non-delayed, but are shifted from the regular pattern. Data pulse 412 is delayed two and a half cycles of the VCO CLOCK signal from data pulse 411. Data pulse 414 is delayed two and a half cycles of the VCO CLOCK signal from data pulse 413. Shifted data pulses 412 and 414 are used to calibrate the phase window centering. In other embodiments, the shifted data pulses may be shifted by amounts other than two and a half cycles.

Data pulses 416, 417, 418, 419, 420, and 421 are data pulses that have been delayed by a half symbol delay circuit. Thus, they are delayed data pulses. Delayed data pulses 416, 417, 418, 419, 420, and 421 correspond to non-delayed data pulses 410, 411, 412, 413, 414, and 415, respectively. Each delayed data pulse follows its corresponding non-delayed data pulse by one half the period of the VCO clock signal.

Data signal input 104 initially provides to the PLL a stream of periodic patterns having a period of four times the period of the VCO clock signal. These patterns will be referred to as 4T patterns. The stream of 4T patterns is of sufficient length to allow the PLL to settle. After the PLL has settled, PWEN* signal input 106 is allowed to go low. After at least a couple of 4T patterns have occurred (to allow the on-time bits to trigger the divide-by-4 clock), a second stream of 4T patterns, which are designed to have a delay from the first stream of 4T patterns of exactly two and a half cycles of the VCO clock, are added to the first stream to produce an input to the PLL that has the two streams of 4T patterns interleaved to form a stream of special 2T patterns. They are referred to as 2T patterns since one pulse occurs every two VCO clock cycles. The calibration of phase window centering is then performed using this stream of special 2T patterns.

Although OS_CAL GATE 202 is described as using an input to the PLL that is a stream of special 2T patterns formed by interleaving two streams of relative phase-shifted 4T patterns, the present invention may be practiced with other patterns, such as two 8T patterns to form a special 4T pattern, two 16T patterns to form a special 8T pattern, etc.

Figure 5:
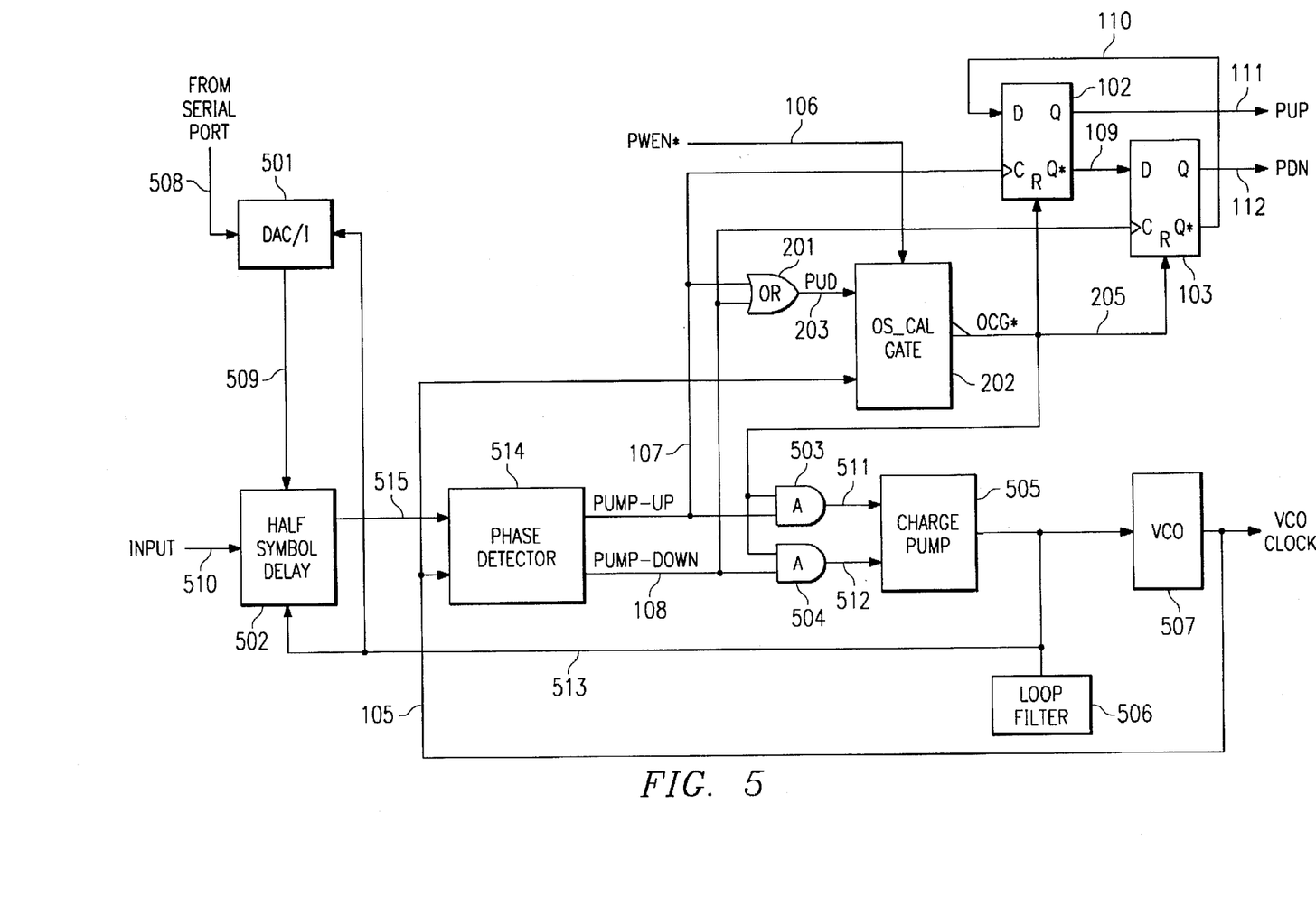
FIG. 5 is a block diagram illustrating the PLL circuit of the preferred embodiment of the present invention.

FIG. 5 is a block diagram illustrating the PLL circuit of the preferred embodiment of the present invention. A serial port provides a data input where digital data may be provided via node 508 to digital to analog converter (DAC/I) 501. Alternatively, this data input may be practiced as a parallel input with a plurality of nodes. DAC/I 501 provides an analog output at node 509 that is coupled to half symbol delay 502. Input 510 is coupled to half symbol delay 502 and is a data input for providing to half symbol delay 502 the incoming data to be processed. Half symbol delay 502 provides an output to phase detector 514 at node 515. Phase detector 514 provides a PUMP UP output signal at node 107 to a first input of AND gate 503, to a first input of OR gate 201, and to the clock input of D flip-flop 102. Phase detector 514 provides a PUMP DOWN output signal at node 108 to a first input of AND gate 504, to a second input of OR gate 201, and to the clock input of D flip-flop 103.

OR gate 201 provides a PUD output signal to OS_CAL GATE 202 at node 203. Enable input signal PWEN* is provided to OS_CAL GATE 202 at node 106. OS_CAL GATE 202 provides an OCG* output signal at node 205. Node 205 is coupled to the reset (R) input of D flip-flop 102, to the reset (R) input of D flip-flop 103, to a second input of AND gate 503, and to a second input of AND gate 504. AND gates 503 and 504 receive the OCG* output signal, which has a low logic level during the two consecutive cycles of the VCO clock signal when a time-shifted data pulse occurs at data input 104. AND gate 503 provides an output at node 511 to charge pump 505. AND gate 504 provides an output at node 512 to charge pump 505. AND gates 503 and 504 prevent pulses in the PUMP UP signal at node 107 and in the PUMP DOWN signal at node 108 from being received by charge pump 505, thereby inhibiting the PUMP UP and PUMP DOWN signals resulting from time-shifted data pulses from influencing charge pump 505. Charge pump 505 provides an output at node 513 to voltage controlled oscillator (VCO) 507, to loop filter 506, to DAC/I 501, and to half symbol delay 502. VCO 507 provides a VCO CLOCK output signal at node 105 to phase detector 514 and to OS_CAL GATE 202.

The Q output of D flip-flop 102 provides output signal PUP at node 111. The Q* inverted output of D flip-flop 102 is coupled to the D input of D flip-flop 103 at node 109. The Q output of D flip-flop 112 provides output signal PDN at node 112. The Q* inverted output of D flip-flop 103 is coupled to the D input of D flip-flop 102 at node 110.

Figure 6:
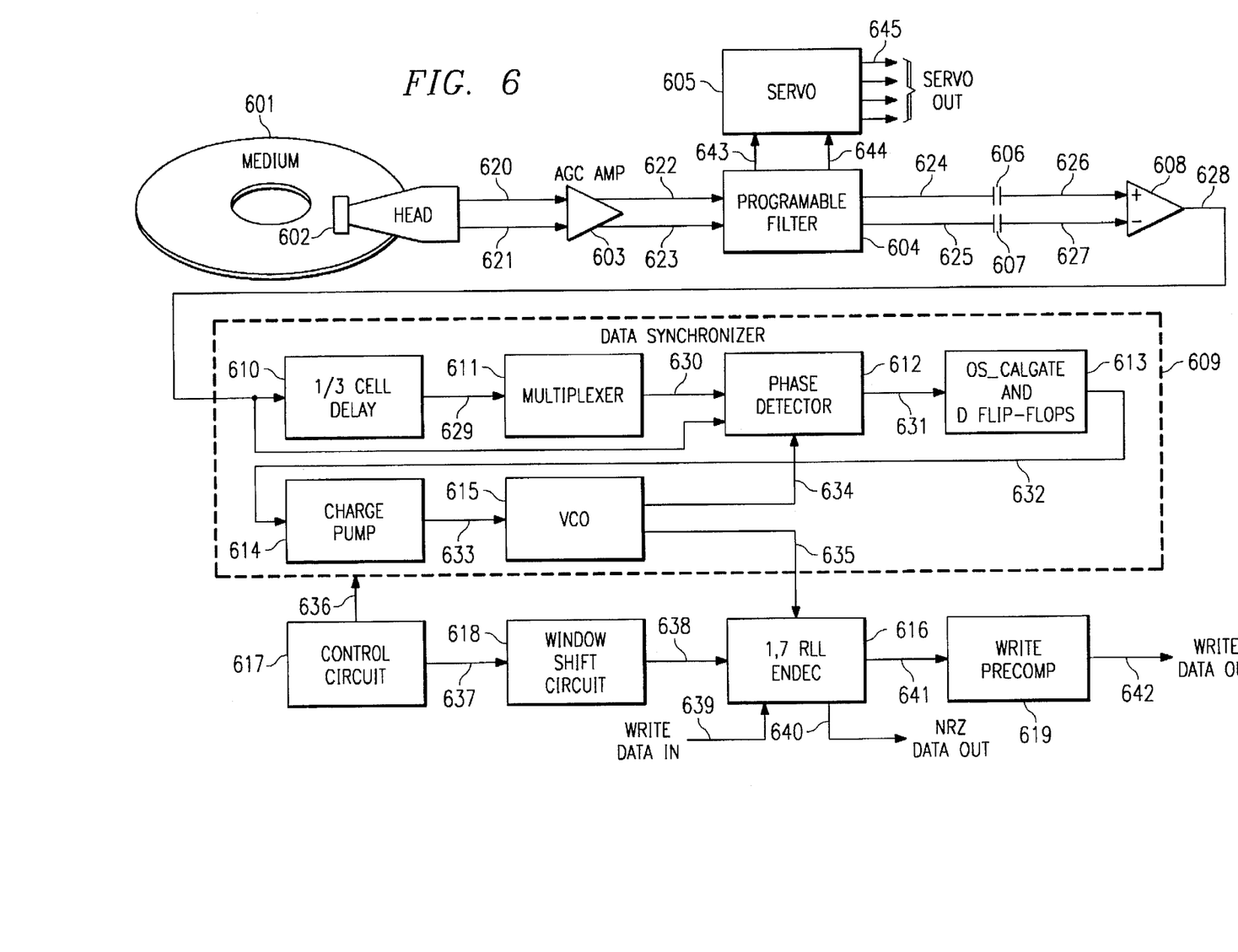
FIG. 6 is a block diagram illustrating use of the present invention in a data storage subsystem.

FIG. 6 is block diagram illustrating use of the present invention in a data storage subsystem. Medium 601 is a data storage medium, for example a magnetic or magneto-optical disk. Head 602 is a transducer for reading data from medium 601. Head 602 is coupled to automatic gain control (AGC) amplifier 603 via differential nodes 620 and 621. AGC amplifier 603 is coupled to programmable filter 604 via differential nodes 622 and 623. Programmable filter 604 is coupled to servo circuit 605 via differential nodes 643 and 644. Servo circuit 605 provides a plurality of servo outputs 645. Programmable filter 604 is coupled to pulse detector 608 via differential signal paths provided by capacitors 606 and 607. Programmable filter 604 is coupled to a first terminal of capacitor 606 via node 624. A second terminal of capacitor 606 is coupled to pulse detector 608 via node 626. Programmable filter 604 is coupled to a first terminal of capacitor 607 via node 625. A second terminal of capacitor 607 is coupled to pulse detector 608 via node 627.

Data synchronizer 609 comprises ⅓ cell delay 610, multiplexer 611, phase detector 612, OS_CAL gate and D flip-flops 613, charge pump 614, and voltage controlled oscillator (VCO) 615. Pulse detector 608 is coupled to ⅓ cell delay 610 and phase detector 612 via node 628. ⅓ cell delay 610 is coupled to multiplexer 611 via node 629. Multiplexer 611 is coupled to phase detector 612 via node 630.

Alternatively, multiplexer 611 may be omitted and ⅓ cell delay 610 coupled directly to phase detector 612. While pulse detector 608 provides non-delayed data pulses to ⅓ cell delay 610 and ⅓ cell delay 610 provides delayed data pulses to phase detector 612. non-delayed data pulses are also provided to phase detector 612 via node 628 for use in arming phase detector 612 to detect the phase of the delayed data pulses relative to the VCO clock signal provided to the phase detector via node 634. By using the non-delayed data pulses to arm phase detector 612, phase detector 612 is prevented from outputting spurious signals when no delayed data pulse is present at phase detector 612.

Phase detector 612 is coupled to OS_CAL gate and D flip-flops 613 via node 631. OS_CAL gate and D flip-flops 613 are coupled to charge pump 614 via node 632. Charge pump 614 is coupled to VCO 615 via node 633. VCO 615 is coupled to phase detector 612 via node 634. VCO 615 is coupled to 1, 7 RLL encoder/decoder (ENDEC) 616 via node 635.

Control circuit 617 is coupled to data synchronizer 609 via node 636. Control circuit 617 is coupled to window shift circuit 618 via node 637. Window shift circuit 618 is coupled to 1,7 RLL ENDEC 616 via node 638.

Write data input 639 is coupled to 1,7 RLL ENDEC 616. 1,7 RLL ENDEC 616 provides non-return-to-zero (NRZ) data output 640. 1,7 RLL ENDEC 616 is coupled to write precompensation circuit 619 via node 641. Write precompensation circuit 619 provides write data output 642.

The read channel circuit amplifies the data signal using an automatic gain control (AGC) amplifier. The AGC amplifier adjusts the level of the data signal to compensate for variations in intensity of the data signal and to provide a constant average signal level or amplitude. A programmable filter circuit then processes the data signal to more clearly define the data from any noise that may be present. The programmable filter also provides signals for use by a servo circuit. The servo circuit provides outputs to control head positioning so that the head accurately follows the tracks of the storage media.

Signals from the programmable filter are capacitively coupled to a pulse detector, which detects and restores the appropriate shape and timing of data pulses. The restored data pulses are passed to a data synchronizer, which uses a phase-locked loop (PLL) to synchronize the data pulses. A control circuit controls the operation of the data synchronizer and a window shift circuit. The synchronized data pulses from the data synchronizer are passed to an encoder/decoder (ENDEC). In a read mode, the ENDEC decodes data and provides an non-return-to-zero (NRZ) data output. In a write mode, the ENDEC encodes data and provides the encoded data to a write precompensation circuit. The write precompensation circuit prepares the encoded data to be written to the storage media.

Figure 7:
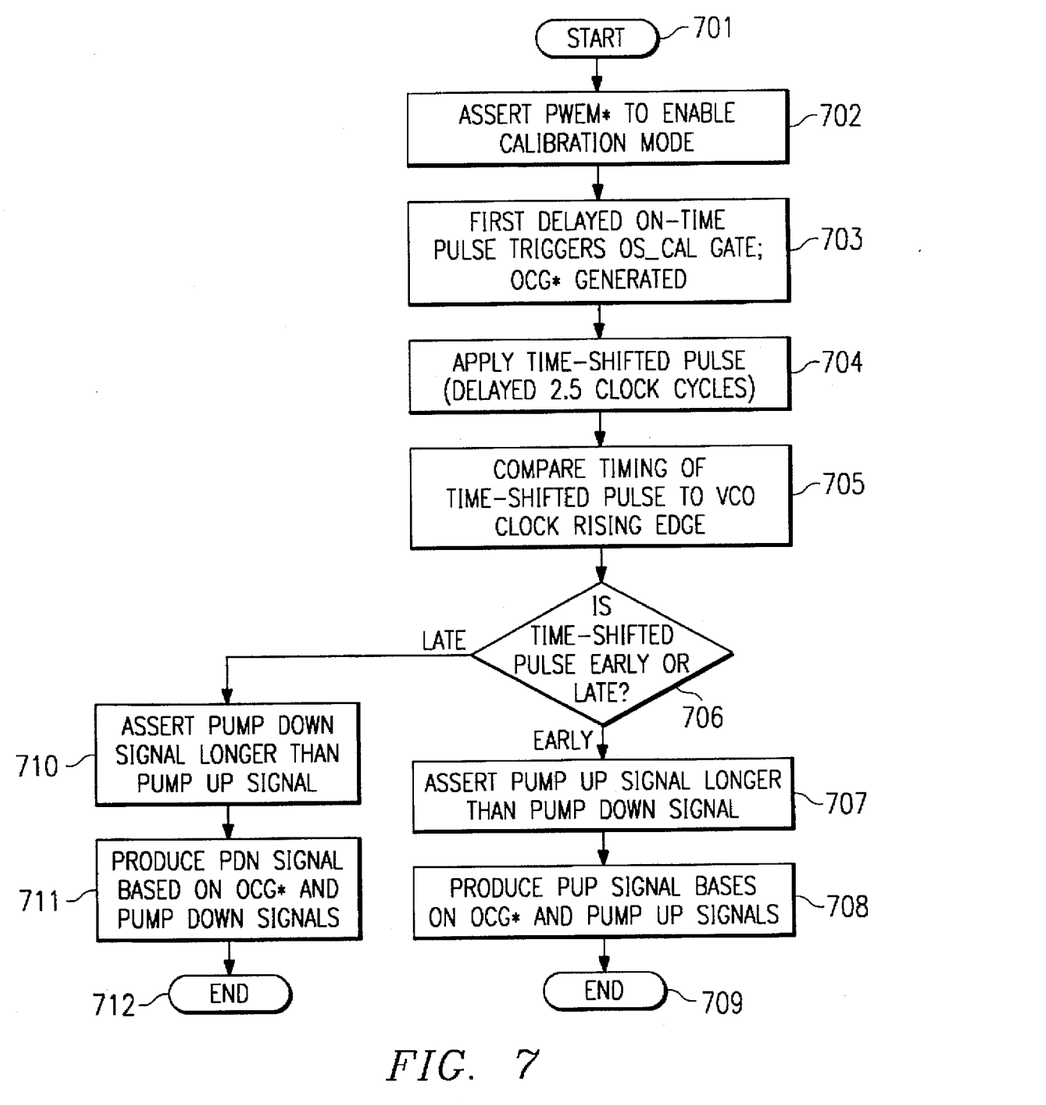
FIG. 7 is a flow chart illustrating a method according to the present invention.

FIG. 7 is a flow chart illustrating a method according to the present invention. The method begins in step 701 and continues in step 702. In step 702, PWEN* signal 106 is asserted to enable the calibration mode. The PWEN* signal is asserted when the PLL is in precise synchronization with the on-time pulses. In step 703, the first delayed on-time pulse will trigger the divide-by-four circuit in the OS_CAL GATE. The OCG and OCG* signals will then be generated. Next, a non-delayed time-shifted pulse that has a time lag of exactly two and one-half clock cycles of the VCO clock signal from the non-delayed on-time pulse is applied to the data input 104 in step 704. As soon as this non-delayed time-shifted data pulse is applied to data input 104, the timing of its rising edge is compared to the timing of the rising edge of VCO clock signal 105 in step 705, and a decision is made as to whether its rising edge is early or late relative to the rising edge of VCO clock signal 105.

If the rising edge of the non-delayed time-shifted pulse is early relative to the rising edge of VCO clock signal 105, the method continues in step 707. In step 707, PUMP UP signal 107 is asserted earlier in time and longer in duration than the PUMP DOWN signal 108. In step 708, PUP signal 111 is produced based on OCG* signal 205. In this case, the method ends in step 709.

If, however, the rising edge of the non-delayed time-shifted pulse is late relative to the rising edge of VCO clock signal 105, the method continues in step 710. In step 710, PUMP DOWN signal 108 is asserted earlier in time and longer in duration than the PUMP UP signal 107. In step 711, PDN signal 112 is produced based on OCG* signal 205. In this case, the method ends in step 712.

Figure 8:
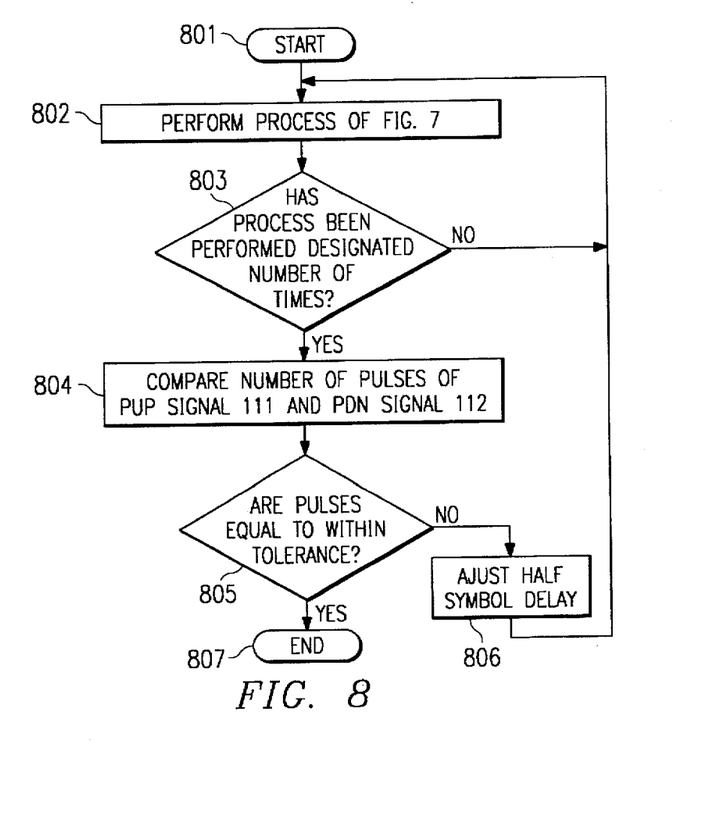
FIG. 8 is a flow chart illustrating a method according to the present invention whereby the process of FIG. 7 is repeated until the half symbol delay calibration is complete.

FIG. 8 is a flow chart illustrating a method according to the present invention whereby the process of FIG. 7 is repeated until the half symbol delay calibration is complete. The process of FIG. 8 begins at step 801 and proceeds to step 802. In step 802, the process of FIG. 7 is performed. Following step 802, a decision is made in step 803 as to whether or not the process of FIG. 7 has been performed a designated number of times. If not, steps 801 and 802 are repeated. Thus, the process of FIG. 7 is repeated for a pre-determined number of time-shifted pulses.

While the process of FIG. 7 is being performed, the number of pulses of the PUP output signal at PUP output 111 and the number of pulses of the PDN output signal at PDN output 112 are counted separately. The number of pulses from PUP output 111 and PDN output 112 are then compared in step 804. Then, in step 805, a decision is made as to whether or not the numbers of PUP and PDN pulses are approximately equal to within a given tolerance (i.e. the absolute difference between the number of pulses at PUP output 111 and the number of pulses at PDN output 112 is less than a given value).

If the counts are not equal to within a predetermined acceptable tolerance, the length of the half symbol delay is adjusted accordingly in step 806 and the process of FIG. 7 is repeated in step 802 until the counts are equal to within the acceptable tolerance. If the counts differ by no more than the acceptable tolerance, the half symbol delay calibration has been accomplished, and the process ends in step 807.

The half symbol delay is adjusted in step 806. This adjustment is preferably performed by loading a different value into a digital-to-analog converter (DAC). The output of the DAC provides a current that charges a capacitor. The capacitor controls the amount of delay introduced by the half symbol delay circuit. Once the half symbol delay circuit has been calibrated, the value loaded into the DAC that resulted in proper calibration may be either stored in non-volatile memory so that it will be loaded automatically or programmed into a separate controller that will load the DAC with the appropriate value. Note that the processes of FIGS. 7 and 8 may be performed during the manufacturing process by which the circuit is produced or by a user of the circuit after it has been produced.

Thus, a method and apparatus for providing calibration of half symbol delay for phase window centering has been provided.

I claim:

1. A method for providing half symbol delay calibration comprising the steps of:

apply an on-time pulse to a first input of a half symbol delay circuit to provide an initial synchronization to said half delay calibration;

applying a time-shifted pulse, with respect to said on-time pulse, to a second input of said half symbol delay circuit;

comparing timing of said time-shifted pulse relative to a VCO clock;

producing a charge pump charging signal and a charge pump discharging signal, said charge pump charging signal and said charge pump discharging signal having active durations based on said timing of said time-shifted pulse relative to said VCO clock;

performing a logical OR operation to produce a signal based on said charge pump charging signal and said charge pump discharging signal;

producing a timing signal having a period equal to an integer multiple of a clock period of said VCO clock;

producing a first output signal based on said charge pump charging signal and said timing signal;

producing a second output signal based on said charge pump discharging signal and said timing signal; and providing said half symbol delay based on said first and second output signals.

2. Apparatus for providing half symbol delay calibration comprising:

a half symbol delay circuit for introducing a delay in a data pulse signal, said data pulse signal comprising a data pulse;

a phase detector coupled to said half symbol delay circuit for detecting a phase of said data pulse to provide a first output signal and a second output signal;

a calibration circuit coupled to said phase detector for calibrating said delay from said half symbol delay circuit to provide a calibration circuit output signal;

a charge pump circuit coupled to said calibration circuit for receiving said first output signal, said second output signal, and said calibration circuit output signal and for providing a charge pump output signal; and a voltage controlled oscillator coupled to said charge pump circuit for receiving said charge pump output signal and for providing a voltage controlled oscillator output signal.

3. Apparatus for providing half symbol delay calibration comprising:

a phase detector for detecting the phase of a data pulse to provide a first output signal and a second output signal;

a first logic gate coupled to said phase detector for receiving said first output signal and said second output signal and for providing a third output signal;

a first D flip-flop coupled to said first logic gate for receiving said third output signal and for providing a fourth output signal;

a second D flip-flop coupled to said first D flip-flop for receiving said fourth output signal and for providing a fifth output signal;

a third D flip-flop coupled to said first D flip-flop for receiving said fourth output signal and for providing a sixth output signal; and a half symbol delay calibration circuit for calibrating said apparatus based on said sixth output signal.

4. Apparatus for providing half symbol delay calibration comprising:

a phase detector for detecting the phase of a data pulse to provide a first output signal and a second output signal;

a first logic gate coupled to said phase detector for receiving said first output signal and said second output signal and for providing a third output signal;

a first D flip-flop coupled to said first logic gate for receiving said third output signal and for providing a fourth output signal;

a second D flip-flop coupled to said first D flip-flop for receiving said fourth output signal and for providing a fifth output signal;

a third D flip-flop coupled to said first D flip-flop for receiving said fourth output signal and for providing a sixth output signal, wherein the apparatus further comprises a second logic gate coupled to said phase detector and to said second D flip-flop for receiving said first output signal and said fifth output signal and for providing a seventh output signal.

5. The apparatus of claim 4 further comprising:

a third logic gate coupled to said phase detector and to said second D flip-flop for receiving said second output signal and said fifth output signal and for providing an eighth output signal.

6. The apparatus of claim 5 further comprising:

a charge pump coupled to said second logic gate and said third logic gate for receiving said seventh output signal and said eighth output signal and for providing a ninth output signal.

7. The apparatus of claim 6 further comprising:

a voltage controlled oscillator coupled to said charge pump for receiving said ninth output signal and for providing a tenth output signal.

8. Apparatus for providing half symbol delay calibration comprising:

a phase detector for detecting the phase of a data pulse to provide a first output signal and a second output signal;

a first logic gate coupled to said phase detector for receiving said first output signal and said second output signal and for providing a third output signal;

a first D flip-flop coupled to said first logic gate for receiving said third output signal and for providing a fourth output signal;

a second D flip-flop coupled to said first D flip-flop for receiving said fourth output signal and for providing a fifth output signal; and a third D flip-flop coupled to said first D flip-flop for receiving said fourth output signal and for providing a sixth output signal, wherein said second D flip-flop further provides a seventh output signal, said third D flip-flop coupled to said second flip flop for receiving said seventh output signal.

* * * * *